United States Patent
Campman et al.

(10) Patent No.: US 7,397,062 B2
(45) Date of Patent: Jul. 8, 2008

(54) HETEROJUNCTION BIPOLAR TRANSISTOR WITH IMPROVED CURRENT GAIN

(75) Inventors: Kenneth Lee Campman, Glendale, AZ (US); Brian Anthony Novak, Peoria, AZ (US)

(73) Assignee: Sumika Electronic Materials, Inc., Phoenix, AZ (US)

( * ) Notice: Subject to any disclaimer, the term of this patent is extended or adjusted under 35 U.S.C. 154(b) by 0 days.

(21) Appl. No.: 11/226,717

(22) Filed: Sep. 13, 2005

(65) Prior Publication Data

US 2007/0057246 A1    Mar. 15, 2007

(51) Int. Cl.
*H01L 29/06* (2006.01)
(52) U.S. Cl. .................. 257/12; 257/22; 257/197; 257/24
(58) Field of Classification Search .............. 257/12, 257/22, 197, E29.11, 24
See application file for complete search history.

(56) References Cited

U.S. PATENT DOCUMENTS

| | | | |
|---|---|---|---|
| 5,161,235 A * | 11/1992 | Shur et al. ................. 257/24 |
| 5,281,551 A * | 1/1994 | Min et al. ................... 117/89 |
| 5,373,186 A | 12/1994 | Schubert et al. | |
| 5,682,040 A | 10/1997 | Imanishi | |
| 5,856,209 A * | 1/1999 | Imanishi ..................... 438/47 |
| 6,914,274 B2 * | 7/2005 | Hiroyama et al. ........... 257/197 |
| 2002/0139997 A1 * | 10/2002 | Tanomura et al. ........... 257/197 |

* cited by examiner

*Primary Examiner*—Zandra V. Smith
*Assistant Examiner*—Swapneel Chhaya
(74) *Attorney, Agent, or Firm*—Wiggin and Dana LLP

(57) ABSTRACT

One aspect of the present invention is directed to a heterojunction bipolar transistor (HBT) comprising: a substrate; a buffer layer of undoped semiconductor material; a sub-collector layer; a collector layer; a base layer; an emitter layer; a emitter cap layer; and a contact layer; wherein a planar doping sheet is included between the substrate layer and the collector layer; and a collector electrode in electrical connection to said collector layer; a base electrode in electrical connection with said base layer; and an emitter electrode provided in electrical connection to said emitter layer.

3 Claims, 6 Drawing Sheets

| 17 — | Contact Layer |
|---|---|
| 16 — | Emitter Cap Layer |
| 15 — | Emitter Layer |
| 14 — | Base Layer |
| 13 — | Collector Layer |
| 12 — | Sub-Collector Layer |
| 11 — | Optional Buffer Layer |
| 10 — | Substrate Layer |

FIG. 1

HETEROJUNCTION BIPOLAR TRANSISTOR WITH IMPROVED CURRENT GAIN

BACKGROUND OF THE INVENTION

1. Field of the Invention

The present invention relates to a heterojunction bipolar transistor (HBT) having low resistance and improved current gain properties by having a planar doping sheet included at some point between the collector layer and the substrate layer.

2. Brief Description of Art

Compound semiconductor devices such as HBTs are used extensively in high frequency applications where high speed device operation is essential. In compound semiconductor devices, large electron mobility, which is pertinent to compound semiconductor materials, facilitates the high speed operation of the device substantially. Generally, HBTs include a heterojunction interface of InGaP or Al GaAs with GaAs in the essential part of the device.

FIG. 1 shows a typical epitaxial layer structure for an HBT. A buffer layer 11 of undoped GaAs is provided on a semi-insulating GaAs substrate 10, followed by a n-type GaAs (e.g. heavily Si-doped) sub-collector layer 12. This is followed by a collector layer of GaAs collector layer 13 on the sub-collector layer. Next, a base layer 14 of p-type GaAs (e.g., GaAs doped with C) is grown on the collector layer 13, and an emitter layer 15 of n-type InGaP (e.g. InGaP doped with Si). This emitter layer 15, thus formed, in turn, is covered with an n-doped GaAs (e.g., GaAs doped with Si) emitter cap layer 16. The final layer is an n-type InGaAs contact layer 17 (e.g., InGaAs doped with Si). Thereby, a layered semiconductor body including the semiconductor layers 11-17 on the substrate 10 is obtained. It should be noted that the deposition of the layers 11-17 is achieved consecutively one after another by employing a vapor phase deposition process such as a MOVPE process.

After the formulation of layers 11-17, this layered semiconductor body as such is subjected to an etching process for partially removing the contact layer 17, emitter cap layer 16, the emitter layer 15, the base layer 13, and the collector layer so that a part of the sub-collector layer 12 and part of base layer 14 are exposed. FIG. 2 shows that by providing ohmic electrodes 18, 19, and 20, respectively, on the contact layer, the exposed surface of the base layer and the exposed surface of the sub-collector layer 12, the fabrication of the HBT is completed.

While advances in HBT fabrication have improved performance, there is still a need for even better performing HBT devices. For example, in an HBT, it is advantageous to have a very heavily doped sub-collector layer since this reduces resistive losses and thereby increases the efficiency of HBT power amplifier circuits. Typically, Si is used as an n-type dopant in the sub-collector layer; however, as the Si doping concentration is increased beyond $3 \times 10^{18}$ cm$^{-3}$, the performance of the HBT is negatively impacted. Specifically, as the resistivity of the sub-collector drops because of an increase in Si doping, the current gain is reduced by factors of two or more. This reduction of current gain will negatively impact circuit performance and may also have adverse effects on the long term HBT device reliability.

BRIEF SUMMARY OF THE INVENTION

Therefore, one aspect of the present invention is directed to a heterojunction bipolar transistor (HBT) comprising: a substrate layer; a buffer layer of undoped semiconductor material; a sub-collector layer; a collector layer; a base layer; an emitter layer; an emitter cap layer; and a contact layer; wherein a planar doping sheet is included between the substrate layer and the collector layer; and a collector electrode in electrical connection to said collector layer; a base electrode in electrical connection with said base layer; and an emitter electrode provided in electrical connection to said emitter layer.

Another aspect of the present invention is directed to a method for fabricating a HBT device comprising the steps of: (1) providing a semi-insulating GaAs substrate layer; (2) forming a buffer layer on said substrate layer; (3) forming a sub-collector layer on said buffer layer; (4) providing a planar doping sheet between the substrate layer and the collector layer; (5) forming a collector layer on said sub-collector layer; (6) forming a base layer on said collector layer; (7) forming an emitter layer on said base layer; (8) forming an emitter cap layer on said emitter layer; (9) subjecting the resulting structure to an etching process to expose surfaces of the collector layer, the base layer and emitter layer; (10) providing a collector electrode connected electrically to said collector layer; (11) providing a base electrode connected electrically to said base layer; and (12) providing an emitter electrode connected electrically to said emitter layer.

One of the advantages of the present invention is that the resulting HBT devices will have sufficient resistivity as well as suitable current gain properties. Additionally, this process reduces variation in the current gain that can be caused by variations in the starting substrate material.

BRIEF DESCRIPTION OF THE DRAWINGS

FIG. 1 is a diagram that illustrates a typical epitaxial layer structure for a heterojunction bipolar transistor.

DETAILED DESCRIPTION OF THE INVENTION

The semi-insulating substrate layer 10 may be made of any appropriate material. The preferred substrate material is semi-insulating Gallium Arsenide (GaAs). This preferred substrate material is commercially available from many sources. This substrate layer 10 is preferably a 4 inch or 6 inch diameter wafer, but may be other dimensions. The wafer is preferably placed in any suitable metallorganic vapor phase epitaxy (MOVPE) reactor or molecular beam epitaxy (MBE) reactor. Most preferably, the semi-insulating substrate layer 10 of GaAs is placed in a reaction chamber of a reduced pressure MOVPE apparatus held at a pressure of 0.1 atm. The substrate temperature is kept at about 700° C. under an arsine flow of 500 sccm for a pre-growth anneal for 15 minutes. The preferred range for temperature is 650-800° C. and the preferred range for arsine flow is 400-2000 sccm.

After the GaAs semi-insulating substrates are annealed, an undoped buffer layer 11 is grown on the substrate layer. This undoped buffer layer 11 may be made of any appropriate material and under any suitable conditions. The undoped buffer layer 11 is preferably an undoped GaAs layer deposited using flows of trimethylgallium (TMGa) and arsine or triethylgalliuim (TEGa) and arsine. The preferred buffer layer thickness is about 50 to about 200 nanometers.

A sub-collector layer 12 is grown over the undoped buffer layer 11 using any appropriate material and under any suitable conditions. Preferably, the deposition of the sub-collector layer 12 of n-type GaAs is conducted on the buffer layer at a substrate temperature of 650° C., while supplying TMGa (trimethylgallium) and AsH$_3$ (arsine) with respective flowrates of 75 sccm and 120 sccm, until the thickness of the layer 12 reaches 500 nm. During the growth of the sub-collector layer 12, Si$_2$H$_6$ is a source of Si that acts in the layer 12 as an n-type dopant. As a result, the layer 12 is most preferably doped with Si to the impurity concentration level of $5\times10^{18}$ cm$^{-3}$. The preferred range for temperature is 600-700° C. The preferred range of the sub-collector layer thickness is 400-1000 nm.

Figure 2:
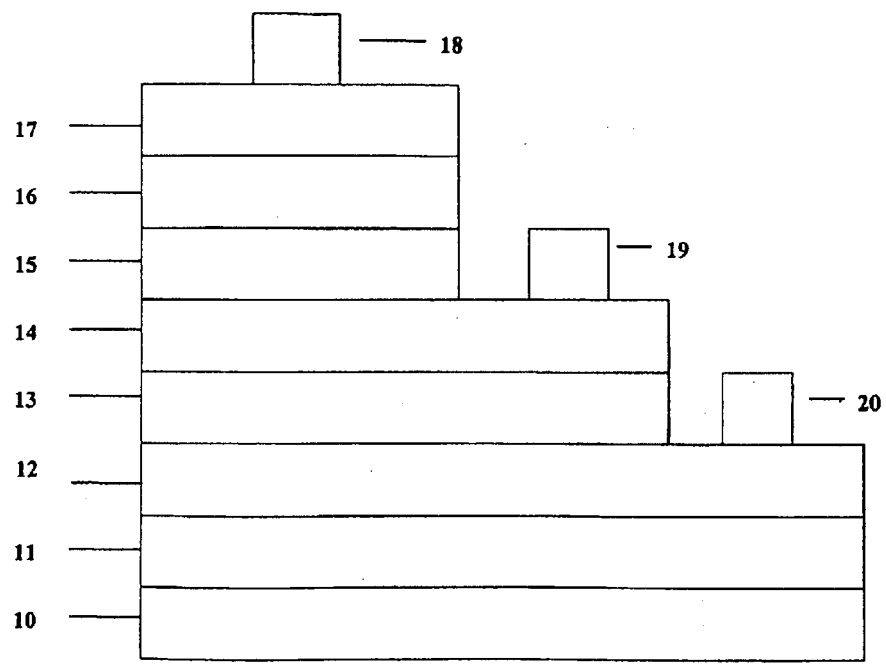
FIG. 2 is a diagram that illustrates a typical HBT structure made from the epitaxial HBT layer structure of FIG. 1.
Figure 3:
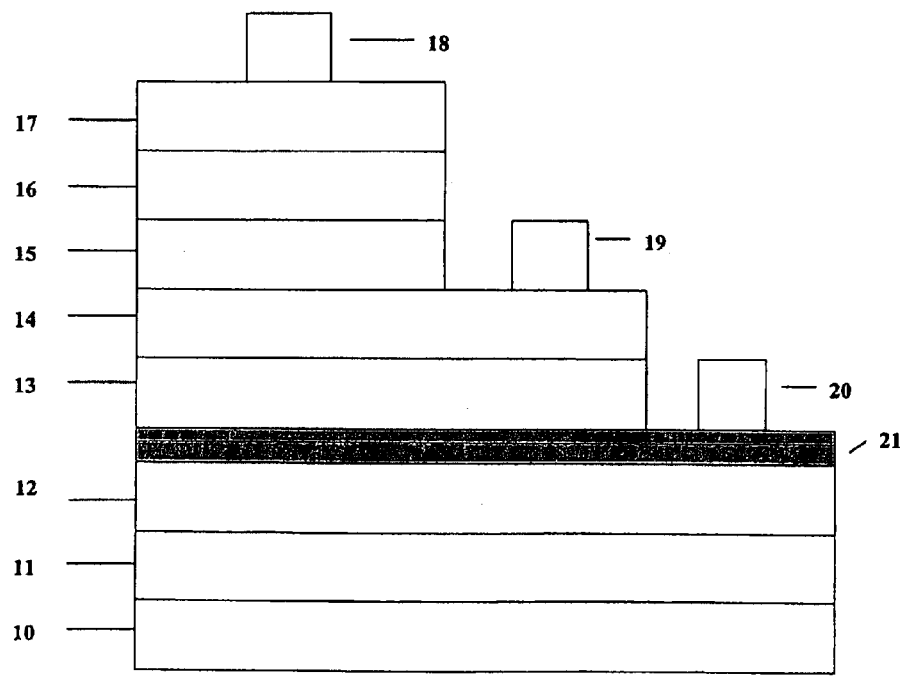
FIG. 3 is a diagram that illustrates a HBT structure of the present invention wherein a planar doping sheet is provided between the sub-collector layer and the collector layer.
Figure 4:
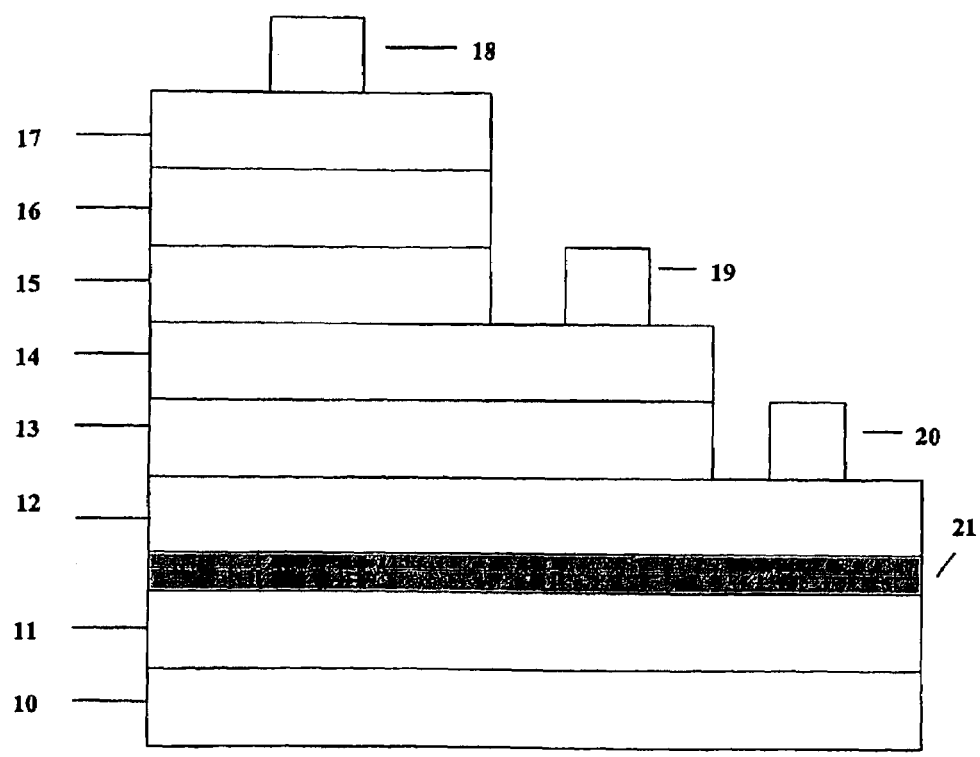
FIG. 4 is a diagram that illustrates a HBT structure of the present invention wherein a planar doping sheet is provided between the buffer layer and sub-collector layer.
Figure 5:
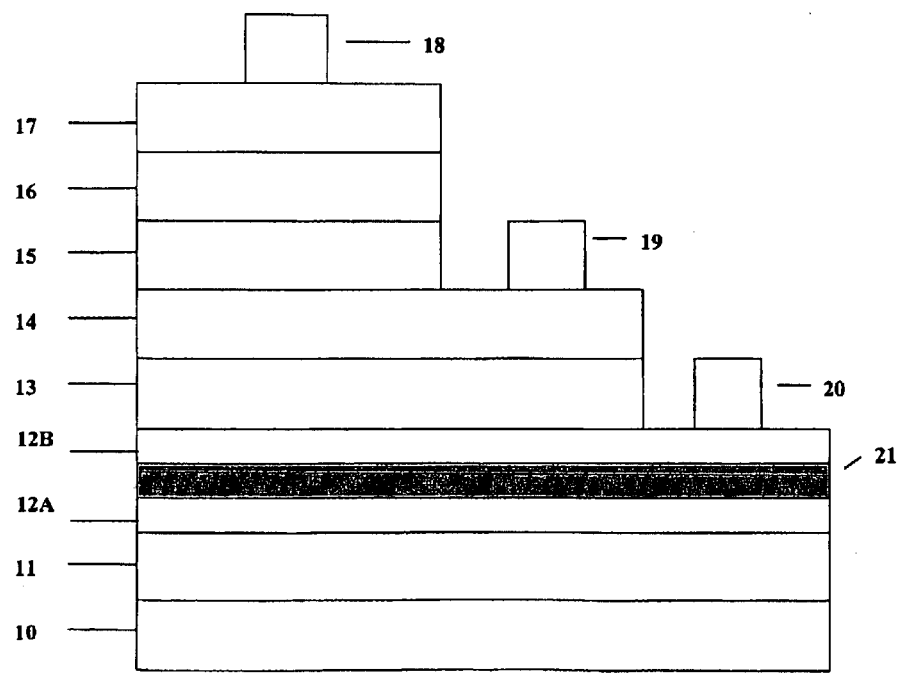
FIG. 5 is a diagram that illustrates a HBT structure of the present invention wherein a planar doping sheet is provided within the sub-collector layer.
Figure 6:
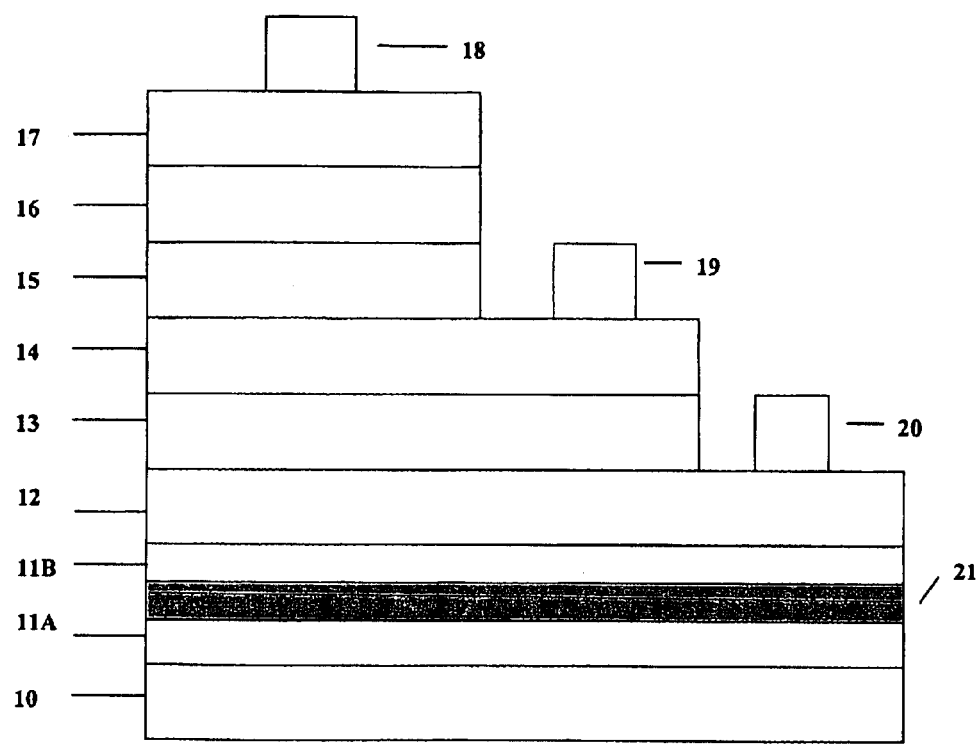
FIG. 6 is a diagram that illustrates a HBT structure of the present invention wherein a planar doping sheet is provided within the buffer layer.

An important feature of the present invention is the placement of a planar dopant sheet 21 between the substrate layer 10 and the collector layer 13. This planar dopant sheet 21 is a layer of dopant atoms such as Si. This planar dopant sheet 21 can be preferably placed either (1) at the interface of the sub-collector layer 12 and the collector layer 13; (2) at the interface of the buffer layer 11 and the sub-collector layer 12; (3) within the sub-collector layer 12; and (4) within the buffer layer 11. FIGS. 3 to 6 illustrate these four preferred embodiments of the present invention. The planar dopant sheet 21 can be made of any appropriate dopant material and may be provided using any appropriate processing conditions.

Additional dopant atoms other than Si may be used including: Te, Se, C, S, O, Zn, Mg, Be and mixtures thereof.

The sheet carrier concentration of dopant atoms may be varied over a wide range. As the dopant atoms are added, the current gain will increase until reaching a saturation point. Further increases in doping concentration will not produce additional increases in current gain, and at some point may damage material crystallinity. Preferably, the sheet carrier concentration of Si atoms introduced is approximately $5\times10^{13}$ cm$^{-2}$.

After the sub-collector layer 12 is formed, a lightly Si-doped collector layer 13 is grown on the sub-collector layer 12. Preferably this collector layer 13 has a thickness of 500 nm in the form of a lightly Si-doped GaAs layer using flows of TMGa, arsine and disilane. The preferred range of thickness of the collector layer 12 is 500-2000 mn.

Next, a doped base layer 14 is provided. This base layer 14 may be made of any appropriate material and by any appropriate processing conditions. Preferably, the base layer 14 is grown on the collector layer 12 with a thickness of 100 nm by continuing the supply of TMGa and AsH$_3$ except that the dopant gas is switched from Si$_2$H$_6$ to CCl$_4$, wherein the CCl$_4$ acts as a source of C that dopes the GaAs layer 14 p-type. It should be noted that CCl$_4$ is supplied with a flowrate of 80 sccm, and the layer 14 is doped to the impurity concentration level of $4\times10^{19}$ cm$^{-3}$. The preferred range of the base layer doping concentration is about $1\times10^{19}$ cm$^{-3}$ to about $5\times10^{19}$ cm$^{-3}$.

An emitter layer 15 is next deposited on base layer 14 using any appropriate material and any appropriate processing conditions. Preferably, the deposition of the emitter layer 15 of n-type InGaP is conducted while maintaining the pressure inside the reaction chamber at 0.1 atm, until the thickness of the emitter layer 15 reaches 50 nm. More specifically, TMIn (trimethylindium) is preferably supplied to the reaction chamber as a source of In together with TMGa (trimethylgallium) acting as a source of Ga and PH$_3$ (phosphine) acting as a source of P, with respective flowrates of 400 sccm, 15 sccm and 600 sccm. Further, Si$_2$H$_6$ is preferably supplied with a flowrate of 2 sccm as a source of Si. Thereby, the emitter layer 15 is doped to n-type with the impurity concentration level of $4\times10^{17}$ cm$^{-3}$. The preferred range for TMIn flow is 300-500 sccm. The preferred range for TMGa flow is 10-20 sccm. The preferred range for PH$_3$ flow is 400-1000 sccm. The preferred range for Si$_2$H$_6$ flow is 0.5-4 sccm. The preferred range for impurity concentration level is $2$-$6\times10^{17}$ cm$^{-3}$. The preferred thickness of the emitter layer is about 30 to 100 nanometers.

An emitter cap layer 16 is next deposited on emitter layer 15 using any appropriate material by any appropriate processing conditions. Preferably, the deposition of the emitter cap layer 16 is conducted on the emitter layer 15 by interrupting the supply of TMIn, TMGa and PH$_3$ and resuming the supply of TMGa and AsH$_3$ with respective flowrates of 26 sccm and 70 sccm. Thereby, the flowrate of Si$_2$H$_6$ is set to 16.7 sccm, and the cap layer 16 is formed with a thickness of 300 nm and with an impurity concentration level of $4\times10^{18}$ cm$^{-3}$, the preferred range of thickness is 100-500nm. The preferred range of doping is $3$-$5\times10^{18}$ cm$^{-3}$. The preferred range of Si$_2$H$_6$ flow is 10-50 sccm.

After the emitter cap layer 16 is deposited, the last layer (InGaAs contact layer 17) is deposited by introducing TMIn, TMGa, and AsH$_3$. Typically the In$_y$Ga$_{1-y}$As contact layer is grown in two steps, the first having an In mole fraction (y) graded from 0 to 0.5 with a thickness of about 15 to 30 nm, and the second having a constant In mole fraction (y) of 0.5 with a thickness of about 15 to 30 nm. The preferred range of thickness for this contact layer is about 30 -60nm. The preferred range of In mole fraction is 0.5-0.7.

In the process of formation of the layered structure of FIGS. 3 to 6, one preferably uses TEGa or TMGa as the source of Ga. Further, in the formation of the base layer 14, one may use various combinations of source materials such as (TMGa, TMAs, CCl$_4$), (TEGa, AsH$_3$, CCl$_4$), (TEGa, TMAs, CBr$_4$), (TMGa, TMAs), (TMGa, AsH$_3$, CBr$_4$), (TMGa, AsH$_3$), and the like, in addition to the foregoing combination of (TMGa, AsH$_3$, CCl$_4$).

Further, the layered structures of FIGS. 3 to 6 thus obtained is subjected to an etching process for exposing the surfaces of the sub-collector layer 12 and the base layer 14, and the emitter electrode 18, the base electrode 19 and the collector electrode 20 are provided on the respective exposed surfaces of the emitter layer 17, the base layer 14 and the sub-collector layer 12. For the HBT devices presented in the examples, a common metal electrode consisting of Ge/Ni/Al (30 nm/30 nm/120nm) is preferably deposited on the emitter, base, and sub-collector layers and subjected to an anneal at 325° C. for 30 seconds according to well-known conventional procedures.

The present invention is further described in detail by means of the following Examples and Comparisons. All parts and percentages are by weight and all temperatures are degrees Celsius unless explicitly stated otherwise.

EXAMPLES

The following comparison and example HBT structures were all grown using metallorganic vapor phase epitaxy (MOVPE) at low pressure (100 torr) in an Aixtron 2600G3 reactor. GaAs semi-insulating substrates (100 mm wafers) with 2 degree misorientation toward the [110] direction were subjected to a pregrowth anneal at temperature of 700° C. for 15 minutes under a 475 sccm flow of arsine prior to growth.

Comparison

HBT Grown without the use of a Planar Doping Sheet

Following the substrate pregrowth anneal, the temperature was lowered to 650° C. for the growth of an undoped GaAs buffer. The buffer was deposited at a growth rate of 4 μm/hr using a 75 sccm flow of trimethylgallium (TMGa) and a 120 sccm flow of arsine. A heavily Si-doped ($5 \times 10^{18}$ cm$^{-3}$) sub-collector layer was then deposited at a growth rate of 4 μm/hr using a 75 sccm flow of trimethylgallium (TMGa) and a 195 sccm flow of arsine with a disilane as a source of Si atoms. Following a brief pause after the growth of sub-collector layer, a lightly Si-doped ($2 \times 10^{16}$ cm$^{-3}$) collector layer was deposited using the same flows of TMGa and arsine as the sub-collector, and the disilane mixture delivered through a dopant dilution manifold to achieve the necessary reduced dopant flows. The remaining layers consist of a C-doped base layer, a Si-doped $In_{0.48}Ga_{0.52}P$ emitter layer, a heavily Si-doped GaAs emitter cap layer, and a heavily Si-doped $In_{0.5}Ga_{0.5}As$ contact layer with the initial portion of that layer compositionally graded from GaAs to $In_{0.5}Ga_{0.5}As$.

Example 1

HBT Grown with Planar Doping Sheet between the Sub-Collector and Collector Layer This example consists of an HBT grown with the same conditions and layers as given in Comparison 1, with the addition of a planar doping layer of Si atoms at the interface between the sub-collector and collector layers. The planar doping layer was deposited by stopping the flow of TMGa, and introducing a 150 sccm flow of a 55 ppm mixture of disilane in $H_2$ for 120 seconds while maintaining a 195 sccm flow of arsine. The sheet concentration of Si atoms deposited by this method is approximately $5 \times 10^{13}$ cm$^{-2}$.

Example 2

HBT Grown with Planar Doping Layer between the Buffer Layer and Sub-Collector Layer This example consists of an HBT grown with the same conditions and layers as given in comparison, with the addition of a planar doping layer of Si atoms at the interface between the buffer layer and sub-collector. The planar doping layer was deposited by stopping the flow of TMGa, and introducing a 150 sccm flow of a 55 ppm mixture of disilane in $H_2$ for 120 seconds while maintaining a 195 sccm flow of arsine. The sheet concentration of Si atoms deposited by this method is approximately $5 \times 10^{13}$ cm$^{-2}$.

Large area HBT devices (75 μm×75 μm emitters) were fabricated from the three samples of Comparison 1 and Examples 1 and 2 and the DC device parameters were measured using a Keithley 4200 Semiconductor Characterization System. The reference sample (Comparison 1) grown without the use of a planar doping sheet exhibited a current gain of 63.7 at a collector current of 100 mA. The HBT of Example 1 with a planar doping sheet at the sub-collector/collector interface had a current gain of 76.4 at a collector current of 100 mA, representing a 20% improvement over Comparison 1. The HBT of Example 2 with a planar doping sheet at the buffer/sub-collector interface had a current gain of 81.0 at a collector current of 100 mA, representing a 27% improvement over Comparison 1. For comparison purposes, all current gain results were scaled to a single base sheet resistance value to eliminate the effect of differences in base sheet resistance on the current gain.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A heterojunction bipolar transistor (HBT) comprising:
   a substrate layer;
   a buffer layer of undoped semiconductor material;
   a sub-collector layer;
   a collector layer;
   a base layer;
   an emitter layer;
   an emitter cap layer;
   a contact layer;
   wherein a planar doping sheet is included within the interface between the buffer layer and the sub-collector layer, and
   a collector electrode in an electrical connection to said collector layer;
   a base electrode in electrical connection with said base layer; and
   an emitter electrode provided in electrical connection to said emitter layer.

2. The HBT of claim 1 wherein the planar doping sheet is made of a dopant material selected from the group of Si, Te, Se, C, S, O, Zn, Mg, Be and mixtures thereof.

3. The HBT of claim 1 wherein the planar doping sheet is made from Si.

* * * * *